(12) United States Patent
Lin (10) Patent No.: US 9,385,661 B1
(45) Date of Patent: Jul. 5, 2016

(54) AMPLIFIER WITH DETERMINISTIC NOISE CANCELLATION AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 13 days.

(21) Appl. No.: 14/621,417

(22) Filed: Feb. 13, 2015

(51) Int. Cl.
*H03F 3/45* (2006.01)
*H03F 1/02* (2006.01)
*H03F 1/56* (2006.01)
*H03F 3/16* (2006.01)
*H03F 3/68* (2006.01)
*H03G 3/30* (2006.01)

(52) U.S. Cl.
CPC ............. *H03F 1/0211* (2013.01); *H03F 1/56* (2013.01); *H03F 3/16* (2013.01); *H03F 3/45071* (2013.01); *H03F 3/68* (2013.01); *H03G 3/30* (2013.01); *H03F 2200/372* (2013.01)

(58) Field of Classification Search
CPC .................................................. H03F 3/45
USPC .................. 330/260, 149, 147, 148
See application file for complete search history.

(56) References Cited

U.S. PATENT DOCUMENTS

| | | | | | |
|---|---|---|---|---|---|
| 5,166,635 | A | * | 11/1992 | Shih ................. | H03F 3/3061 330/253 |
| 5,767,722 | A | * | 6/1998 | Kasha ................. | H03H 19/004 326/30 |
| 6,298,226 | B1 | * | 10/2001 | Lloyd ................. | H03F 1/303 455/296 |
| 2001/0016021 | A1 | * | 8/2001 | Chan ................. | H04B 1/586 375/346 |
| 2005/0168905 | A1 | * | 8/2005 | Kimura ................. | G09G 3/3283 361/204 |
| 2007/0291930 | A1 | * | 12/2007 | Apfel ................. | H03F 3/347 379/413 |

* cited by examiner

*Primary Examiner* — Patricia T Nguyen
(74) *Attorney, Agent, or Firm* — McClure, Qualey & Rodack, LLP (57) ABSTRACT

In one embodiment, a circuit comprising a passive input network of an input impedance configured to couple an input voltage to a first circuit node; an adaptive current source configured to output an adaptive bias current to the first circuit node; a cascode device controlled by a control voltage and configured to receive a sum current from the first circuit node and output an output current to a second circuit node; and a load network of a load impedance configured to provide termination to the second circuit node, wherein the adaptive bias current is dynamically adapted to track a deterministic noise component in the input voltage.

20 Claims, 6 Drawing Sheets

AMPLIFIER WITH DETERMINISTIC NOISE CANCELLATION AND METHOD THEREOF

BACKGROUND OF THE INVENTION

1. Field of the Invention

The present invention generally relates to amplifiers, and also relates to noise cancellation.

2. Description of Related Art

Persons of ordinary skill in the art understand terms and basic concepts related to microelectronics that are used in this disclosure, such as "voltage," "current," "gain," "impedance," "circuit," "network," "cascode," "current source," "signal," "PMOS (p-channel metal oxide semiconductor)," "circuit node," "switch," "complement," "resistor," "tunable resistor," "single-ended," "differential," "opamp (operational amplifier)," and "gain-boosting." Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

An amplifier is an apparatus widely used in a receiver for receiving an input voltage $V_I$ and outputting an output voltage $V_O$ such that $$V_O \approx G \cdot V_I \quad (1)$$

Here, G is a gain of the amplifier.

In many applications, the input voltage $V_I$ contains a noise component that is deterministic and can be accurately estimated. For instance, in a full-duplex transceiver comprising a transmitter and a receiver, wherein transmission of a first signal by the transmitter and reception of a second signal by the receiver occur concurrently, a part of the first signal leaks from the transmitter into the receiver and combines with the second signal to form a third signal. The part of the first signal that leaks into the receiver and combines with the second signal is often referred to as an "echo." The third signal, instead of the second signal, is what the receiver actually receives in the presence of the echo. Although the echo is a noise component within the third signal, as far as the receiver is concerned, it is not a random noise. Instead, the echo is a leakage of the first signal from the transmitter, and therefore correlates well with the first signal, which is readily known by the transmitter. By examining a correlation between the third signal and the first signal, the echo can be estimated. The echo is thus a deterministic noise that can be estimated, and must be cancelled by the receiver to assure good performance for the receiver. In U.S. Pat. No. 7,269,211, Lin et at teaches a method for echo reduction, wherein amplification and echo cancellation (which is a special case of deterministic noise cancellation) are two separate functions and fulfilled by two separate functional blocks of the receiver.

What is desired and disclosed is: an apparatus that fulfills amplification and deterministic noise cancellation at the same time, and method thereof.

BRIEF SUMMARY OF THIS INVENTION

An objective of the present invention is to have an amplifier that inherently fulfills both amplification and deterministic noise cancellation.

An objective of the present invention is to have an amplifier that inherently fulfills summing, amplification, and deterministic noise cancellation.

An objective of the present invention is to dynamically adjusts a bias current of an amplifier so as to fulfill amplification and deterministic noise cancellation concurrently.

An objective of the present invention is to use an amplifier of low input impedance and dynamically adjusted bias current to amplify an input signal and remove a deterministic noise component therein.

In an embodiment, a circuit comprises: a passive input network of an input impedance configured to couple an input voltage to a first circuit node; an adaptive current source configured to output an adaptive bias current to the first circuit node; a cascode device controlled by a control voltage and configured to receive a sum current from the first circuit node and output an output current to a second circuit node; and a load network of a load impedance configured to provide termination to the second circuit node, wherein the adaptive bias current is dynamically adapted to track a deterministic noise component in the input voltage. In an embodiment, the passive input network comprises a series connection of a resistor and a capacitor. In an embodiment, the adaptive current source comprises a plurality of current sources configured to output a plurality of currents that can be conditionally passed to the first circuit node in accordance with a plurality of logical signals, respectively. In an embodiment, the circuit further comprises a gain boosting operational amplifier configured to receive a voltage at the first circuit node and output the control voltage. In an embodiment, the deterministic noise is an echo. In an embodiment, a gain factor is determined by a ratio between the load impedance and the input impedance. In an embodiment, the load impedance is tunable.

In an embodiment, a circuit comprises: a first passive input network of a first input impedance configured to couple a first input voltage to a first circuit node; a second passive input network of a second input impedance configured to couple a second input voltage to the first circuit node; an adaptive current source configured to output an adaptive bias current to the first circuit node; a cascode device controlled by a control voltage and configured to receive a sum current from the first circuit node and output an output current to a second circuit node; and a load network of a load impedance configured to provide termination to the second circuit node, wherein the adaptive bias current is dynamically adapted to track a deterministic noise component in one of the first input voltage and the second input voltage. In an embodiment, both the first passive input network and the second passive input network comprise a series connection of a resistor and a capacitor. In an embodiment, the adaptive current source comprises a plurality of current sources outputting a plurality of currents that can be conditionally passed to the first circuit node in accordance with a plurality of logical signals, respectively. In an embodiment, the circuit further comprises a gain boosting operational amplifier configured to receive a voltage at the first circuit node and output the control voltage. In an embodiment, a first gain factor is determined by a ratio between the load impedance and the first input impedance and a second gain factor is determined by a ratio between the load impedance and the second input impedance. In an embodiment, the adaptive bias current is dynamically adapted to track a sum of a first deterministic noise component in the first input voltage and a second deterministic noise in the second input voltage.

In an embodiment, a method comprising: receiving an input voltage; coupling the input voltage, using a passive input network, to a first circuit node; providing an adaptive bias current to the first circuit node; passing a sum current from the first circuit node to a second circuit node using a cascode device controlled by a control voltage; terminating the second circuit node with a load network; and adapting the adaptive bias current in accordance with a deterministic noise in the input voltage. In an embodiment, the method further comprises: dynamically adjusting the control voltage in accordance with a negative feedback from a voltage at the first circuit node. In an embodiment, the negative feedback comprises using an operational amplifier receiving the voltage at the first circuit node and outputting the control voltage.

In an embodiment, a method comprises: receiving a first input voltage; coupling the first input voltage, using a first passive input network, to a first circuit node; receiving a second input voltage; coupling the second input voltage, using a second passive input network, to the first circuit node; providing an adaptive bias current to the first circuit node; passing a sum current from the first circuit node to a second circuit node using a cascode device controlled by a control voltage; terminating the second circuit node with a load network; and adapting the adaptive bias current in accordance with a deterministic noise in one of the first input voltage and the second input voltage. In an embodiment, the method further comprises: dynamically adjusting the control voltage in accordance with a negative feedback from a voltage at the first circuit node. In an embodiment, the negative feedback comprises using an operational amplifier receiving the voltage at the first circuit node and outputting the control voltage.

DETAILED DESCRIPTION OF THIS INVENTION

The present invention relates to amplifiers, and also relates to deterministic noise cancellation. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

The present invention is disclosed in an "engineering sense," wherein a first quantity is said to be "equal to" a second quantity if a difference between the first quantity and the second quantity is smaller than a given tolerance. For instance, 100.2 mV is said to be equal to 100 mV if the given tolerance is 0.5 mV. Likewise, a physical quantity is said to be pre-determined if the physical quantity is established by engineering means so as to be equal to a pre-determined value in the engineering sense. For instance, a voltage is said to be pre-determined if it is generated by an apparatus so that the voltage is equal to a pre-determined value (say, 100 mV). Transfer characteristics of a device are said to be pre-known if an output of the device in response to a given input of the device is pre-determined by engineering means.

Figure 1:
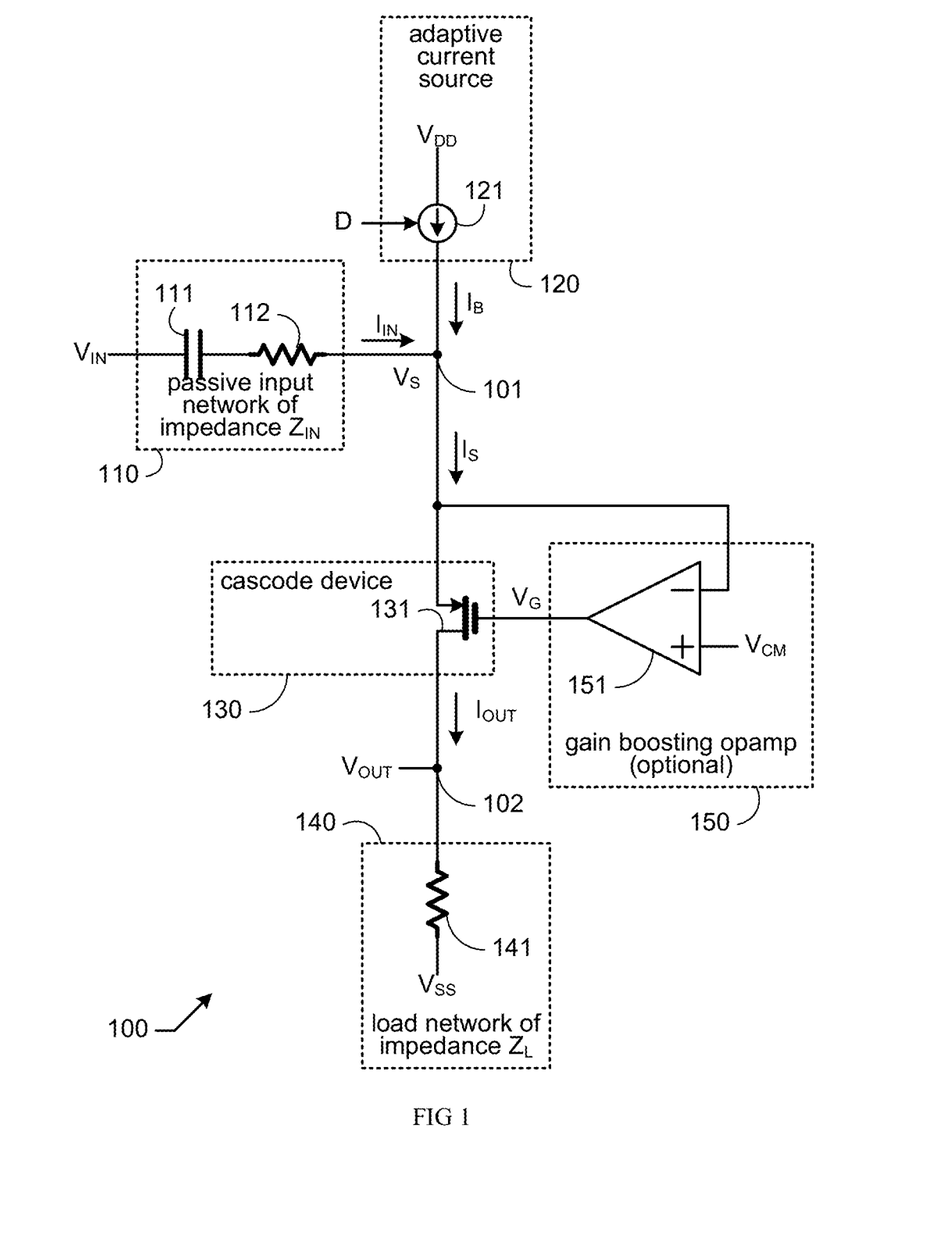
FIG. 1 depicts a schematic diagram of an amplifier in accordance with an embodiment of the present invention.

FIG. 1 shows a schematic diagram of an amplifier 100 in accordance with an embodiment of the present invention. Amplifier 100 comprises: a passive input network 110 of an input impedance $Z_{IN}$ (which in this particular exemplary embodiment comprises a serial connection of a capacitor 111 and a resistor 112) for coupling an input voltage $V_{IN}$ to a first circuit node 101; an adaptive current source 120, which in this exemplary embodiment comprises a digitally controlled current source 121 controlled by a digital signal D, for providing an adaptive bias current $I_B$ to the first circuit node 101; a cascode device 130 (which in this particular exemplary embodiment comprises PMOS transistor 131) controlled by a control voltage $V_G$ for coupling the first circuit node 101 to a second circuit node 102; and a load network 140 of a load impedance $Z_L$ (which in this particular exemplary embodiment comprises a resistor 141) providing termination for the second circuit node 102. Throughout this disclosure, $V_{DD}$ denotes a power supply node, and $V_{SS}$ denotes a ground node. In FIG. 1, $I_{IN}$ denotes an input current injected into the first circuit node 101 from the passive input network 110, $V_S$ denotes a voltage at the first circuit node 101, $I_S$ denotes a sum current flowing from the first circuit node 101 into the cascode device 130, $I_{OUT}$ denotes an output current flowing out of the cascode device 130 into the second circuit node 102; $V_{OUT}$ denotes an output voltage at the second circuit node 102. Due to using the cascode device 130, the first circuit node 101 is a low impedance node (the principle that an input impedance of a cascode device is low is known to those of ordinary skill in the art and thus not described in detail here). Therefore, the input current $I_{IN}$ is approximately equal to the input voltage $V_{IN}$ divided by the input impedance $Z_{IN}$, i.e., $$I_{IN} \approx V_{IN}/Z_{IN} \quad (2)$$

The input voltage $V_{IN}$ contains a deterministic voltage noise $V_{DN}$ which can be estimated. The input current $I_{IN}$, therefore contains a deterministic current noise $I_{DN}$ approximately equal to the deterministic voltage noise $V_{DN}$ divided by the input impedance $Z_{IN}$, i.e., $$I_{DN} \approx V_{DN}/Z_{IN} \quad (3)$$

Since the deterministic voltage noise $V_{DN}$ can be estimated, the deterministic current noise $I_{DN}$ can be estimated using equation (3). The adaptive bias current $I_B$ is adapted by the digital signal D to offset the deterministic current noise $I_{DN}$, i.e., $$I_B = I_F + I_{OS}, \quad (4)$$

where $I_F$ is a fixed current and $I_{OS}$ is an offset current used to offset the deterministic current noise $I_{DN}$, i.e., $I_{OS} \approx -I_{DN}$. Therefore, equation (4) can be rewritten as $$I_B \approx I_F - I_{DN} \approx I_F - V_{DN}/Z_{IN}. \quad (5)$$

As a result, the sum current $I_S$, which is equal to a sum of the input current $I_{IN}$ and the adaptive bias current $I_B$, contains substantially no deterministic noise. The cascode device 130 makes the output current $I_{OUT}$ substantially equal to the sum current $I_S$. Therefore, $$I_{OUT} \approx I_S = I_{IN} + I_B \approx V_{IN}/Z_{IN} + I_F - V_{DN}/Z_{IN} = I_F + (V_{IN} - V_{DN})/Z_{IN}. \quad (6)$$

The output voltage $V_{OUT}$ is equal to the output current $I_{OUT}$ times the load impedance $Z_L$, i.e., $$V_{OUT} \approx I_F \cdot Z_L + (V_{IN} - V_{DN}) \cdot Z_L/Z_{IN}. \quad (7)$$

Note that the first term $I_F \cdot Z_L$ in equation (7) is a fixed DC (direct current) component that is independent of the input signal $V_{IN}$ and can be dropped as far as AC (alternative current) application is concerned. Therefore, we can write $$V_{OUT} \approx (V_{IN} - V_{DN}) \cdot G. \tag{8}$$

where $$G = Z_L/Z_{IN}. \tag{9}$$

Equation (8) shows that amplifier 100 fulfills both amplification and deterministic noise cancellation functions.

Although the cascode device 130 makes the first circuit node 101 a low impedance node, the impedance might not be sufficiently low for equation (2) to be sufficiently accurate. In an optional embodiment, a gain-boosting opamp 150, which in this particular exemplary embodiment comprises an operation amplifier 151, is incorporated. The gain boosting opamp 150 dynamically adjusts the control voltage $V_G$ in a closed loop manner using negative feedback in accordance with sensing the voltage $V_S$ at the first circuit node 101. When $V_S$ is too high (low), the gain boosting opamp 150 lowers (raises) the control voltage $V_G$, so as to lower (raise) $V_S$. As a result, $V_S$ is steady and nearly independent of the sum current $I_S$. This effectively makes the first circuit node 101 a virtual ground. In the particular exemplary embodiment shown in FIG. 1, $V_{CM}$ is a common-mode voltage, and the operational amplifier 151 adjusts the control voltage $V_G$ so as to make $V_S$ equal to $V_{CM}$.

Figure 2:
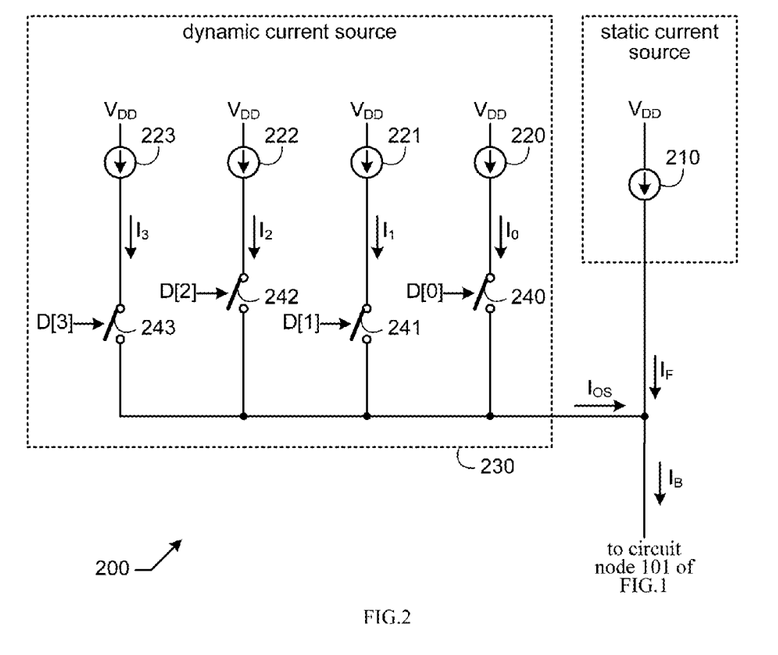
FIG. 2 depicts a schematic diagram of an adaptive current source suitable for use in the amplifier of FIG. 1.

FIG. 2 shows a schematic diagram of an adaptive current source 200 suitable for embodying the adaptive current source 120 of FIG. 1. By way of example but not limitation, the digital signal D is a four-bit word comprising four bits D[3], D[2], D[1], and D[0]. Adaptive current source 200 comprises a static current source 210 outputting the fixed current $I_F$, and a dynamic current source 230 outputting the offset current $I_{OS}$. The dynamic current source 230 comprises four current sources 220~223 for outputting four currents $I_0$~$I_3$, respectively, and four switches 240~243, for effectively, conditionally enabling the four currents $I_0$~$I_3$ in accordance with the four bits D[0]~D[3], respectively. Mathematical, the offset current $I_{OS}$ can be expressed as:

$$I_{OS} = D[0] \cdot I_0 + D[1] \cdot I_1 + D[2] \cdot I_2 + D[3] \cdot I_3 \tag{10}$$

Therefore, the digital signal D can dynamically control the offset current $I_{OS}$ so as to offset the deterministic current noise $I_{DN}$. As a result, the deterministic voltage noise $V_{DN}$ in the input voltage $V_{IN}$ is cancelled.

Figure 3:
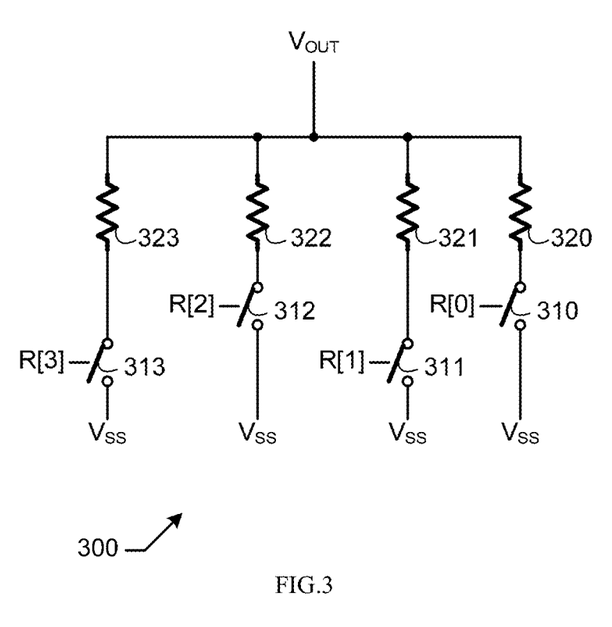
FIG. 3 depicts a schematic diagram of a tunable resistor suitable for use in the amplifier circuit of FIG. 1.

Now refer back to FIG. 1. In an embodiment, the load impedance $Z_L$ of the load network 140 is tunable. This allows the gain of amplifier 100 to be tunable. In an embodiment, the resistor 141 is a tunable resistor. By way of example but not limitation, FIG. 3 shows a schematic diagram of a tunable resistor 300, which can embody load network 141 of FIG. 1, in accordance with an embodiment of the present invention. Tunable resistor 300 comprises resistors 320~323 and switches 310~313 controlled by a digital code R[3:0] to embody a tunable resistor with resistance determined by the digital code R[3:0]. The principle of a tunable resistor 300 is obvious to those of ordinary skill in the art and thus not described in detail here.

Figure 4:
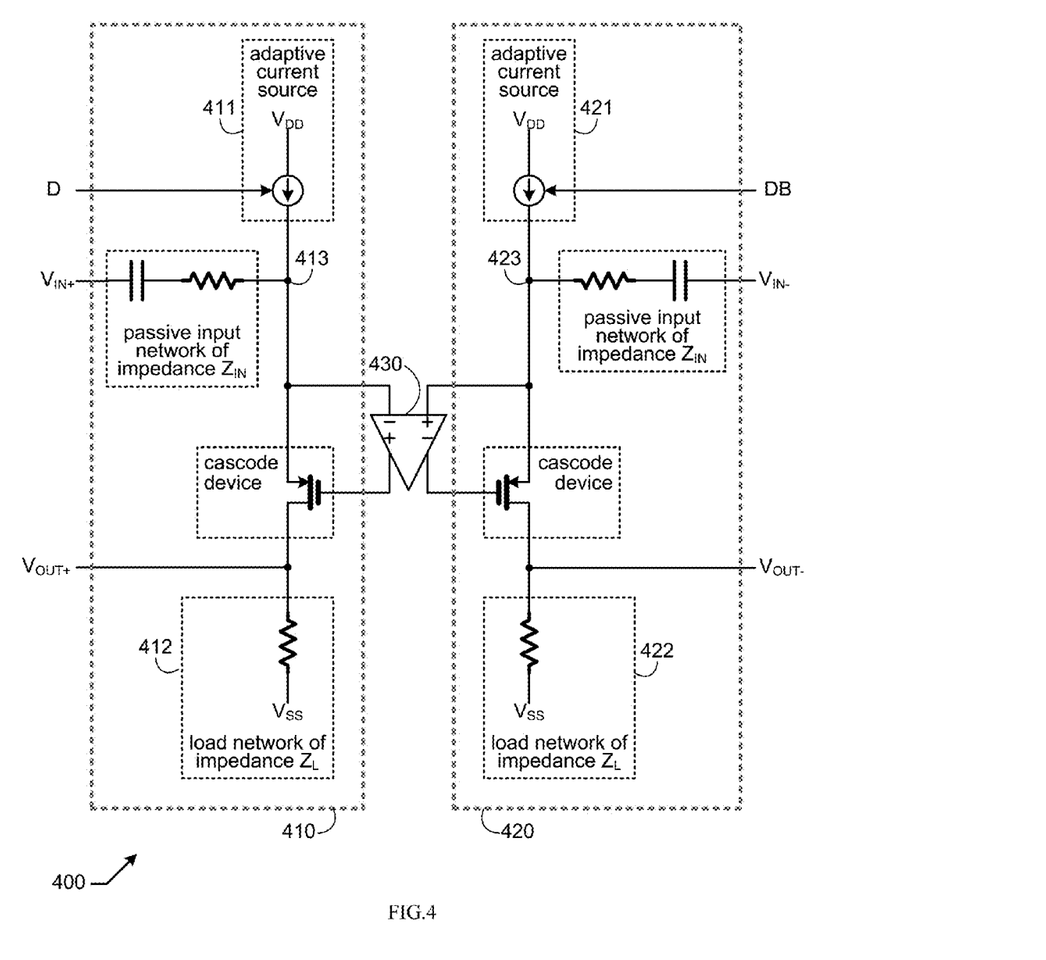
FIG. 4 depicts a schematic diagram of a differential amplifier in accordance with an embodiment of the present invention.
Figure 5:
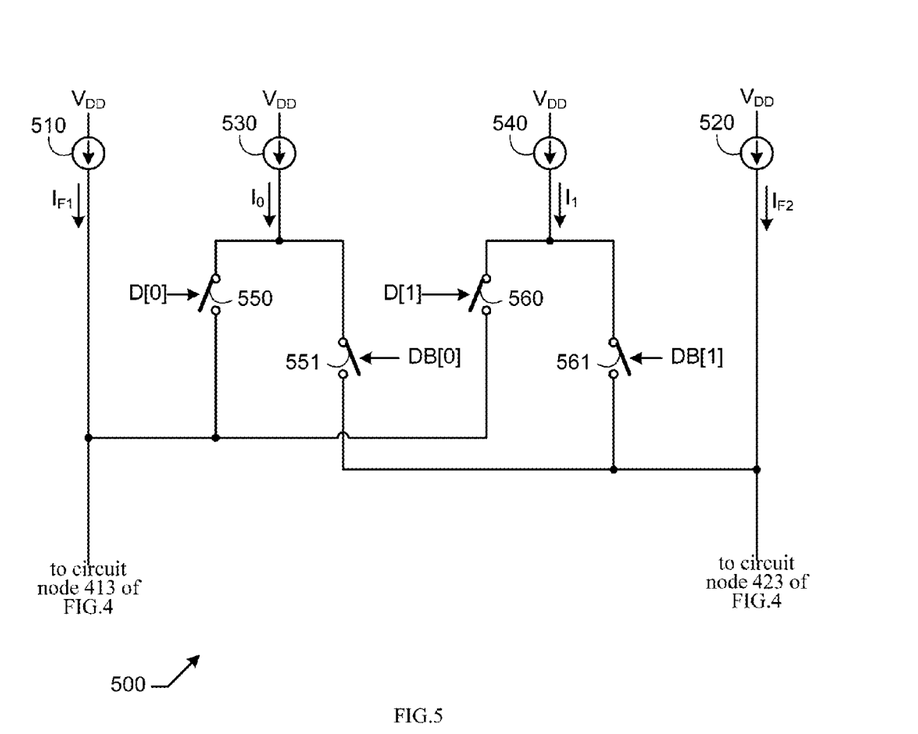
FIG. 5 depicts a schematic diagram of a differential adaptive current source suitable for use in the differential amplifier of FIG. 4.

In many applications, circuit designers prefer to perform signal processing in differential signaling architecture. In differential signaling, a signal comprises a first end (often referred to as a positive end) and a second end (often referred to as a negative end), and is processed by a circuit comprising a first half and a second half. For instance, the input voltage $V_{IN}$ comprises a first end $V_{IN+}$ and a second end $V_{IN-}$, while the output voltage $V_{OUT}$ comprises a first end $V_{OUT+}$ and a second end $V_{OUT-}$. Although amplifier 100 of FIG. 1 employs a single-ended architecture, circuit designers can simply employ two copies of amplifier 100, using one of the two copies as the first half for receiving the first end of the input voltage $V_{IN+}$ and outputting the first end of the output voltage $V_{OUT+}$, and using the other one of the two copies as the second half for receiving the second end of the input voltage $V_{IN-}$ and outputting the second end of the output voltage $V_{OUT-}$. Since the first half and the second half are mutually complementary, the digital signal D that the first half and the second half receives also must be complementary. For instance, if the digital signal D, e.g., the four-bit digital word D[3:0] per the example shown in FIG. 2, that the first half received is 4'b1000, then the digital signal D that the second half received must be its complement, i.e., 4'b0111. If circuit designers choose to include the optional gain-boosting opamp 150, then there will be two single-ended operational amplifiers (such as the single-ended operational amplifier 151) that are needed. Alternatively, circuit designers can opt to combine the two single-ended operational amplifiers into one fully-differential operational amplifier. FIG. 4 shows a schematic diagram of a differential amplifier 400 with deterministic noise cancellation using a fully-differential operational amplifier for gain boosting. Differential amplifier 400 comprises a first amplifier 410 receiving the first end of the input voltage $V_{IN+}$ and outputting the first end of the output voltage $V_{OUT+}$, a second amplifier 420 receiving the second end of the input voltage $V_{IN-}$ and outputting the second end of the output voltage $V_{OUT-}$, and a fully-differential operational amplifier 430 for embodying the function of gain boosting for both the first amplifier 410 and the second amplifier 420. The first amplifier 410 and the second amplifier 420 are both identical to amplifier 100 of FIG. 1 without the optional gain-boosting amplifier 150, which is effectively embodied by the fully-differential operational amplifier 430. Both single-ended operational amplifiers and fully-differential operational amplifiers are well known in the prior art and thus not described in detail here. In FIG. 4, the adaptive current source 411 within the first amplifier 410 is controlled by the digital signal D, while the adaptive current source 421 within the second amplifier 420 is controlled by a complementary digital signal DB, which is a complement of the digital signal D. Due to complementary nature between the adaptive current source 411 within the first amplifier 410 and the adaptive current source 421 within the second amplifier 420, the two adaptive current sources 411 and 421 can also be combined into a differential adaptive current source. FIG. 5 shows a schematic of a differential adaptive current source 500 that can be used to replace the two adaptive current sources 411 and 421. For brevity, the digital signal D is a two-bit digital word D[1:0] in this exemplary embodiment just to illustrate the principle, while those of ordinary skill in the art can freely extend the principle to more bits. DB[1:0] is complementary to D[1:0]. For instance, if D[1:0]=2'b10, then DB[1:0]=2'b01. Differential adaptive current source 500 comprises: a first fixed current source 510 for outputting a first fixed current $I_{F1}$ to circuit node 413 of FIG. 4; a second fixed current source 520 for outputting a second fixed current $I_{F2}$ to circuit node 423 of FIG. 4; two current sources 530 and 540 for outputting currents $I_0$ and $I_1$, respectively; two sets of complementary switches, 550-551 and 560-561, for passing $I_0$ and $I_1$ to either circuit node 413 of FIG. 4 or circuit node 423 of FIG. 4, depending on D[0] and D[1], respectively. FIG. 5 is self-explanatory to those of ordinary skill in the art and thus not described in detail here.

Now refer back to FIG. 1. The passive input network 110 comprises capacitor 111, which serves to provide an AC coupling so that the DC voltage level at the first circuit node 101 is separated from the DC voltage level of the input voltage $V_{IN}$.

Figure 6:
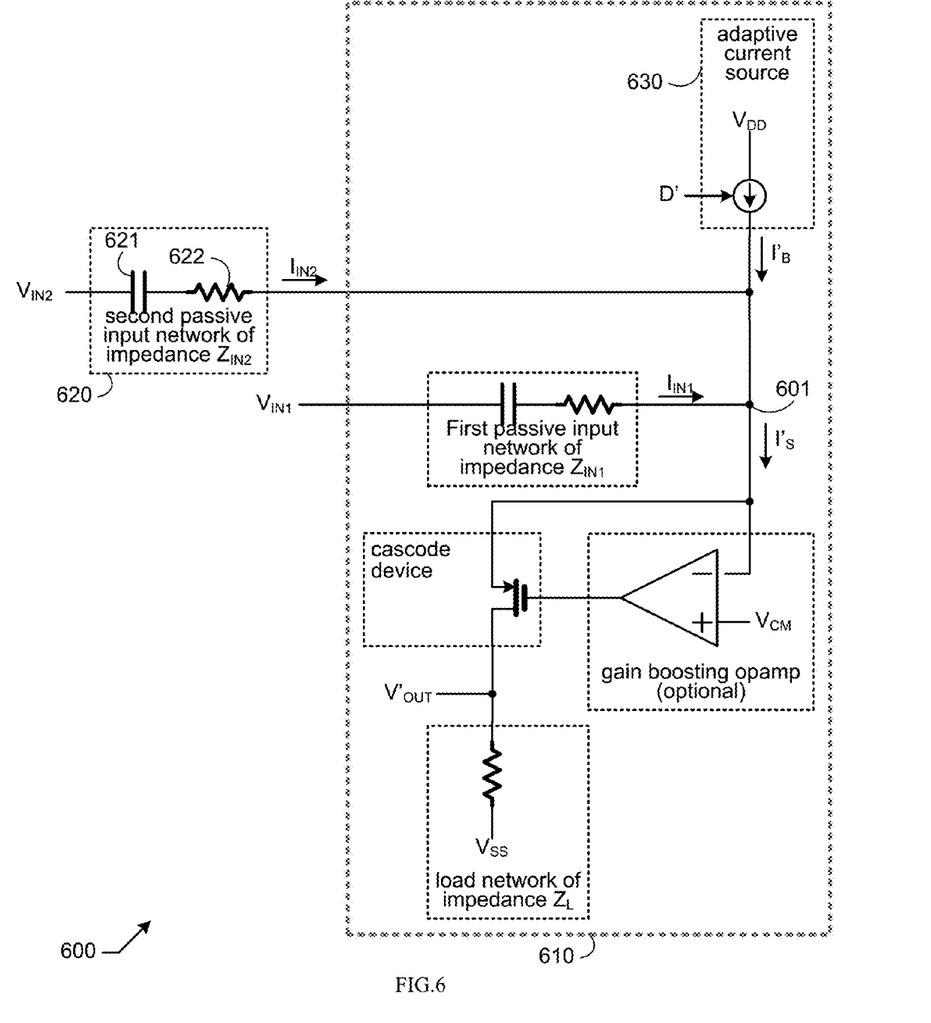
FIG. 6 shows a schematic diagram of another amplifier in accordance with another embodiment of the present invention.

In a further embodiment, amplifier 100 of FIG. 1 is expanded to receive a first input voltage $V_{IN1}$ and a second input voltage $V_{IN2}$, as illustrated by a schematic diagram of amplifier 600 depicted in FIG. 6. Amplifier 600 comprises a core part 610 and an extension part 620. The core part 610 is exactly the same as amplifier 100 of FIG. 1 except for differences in labeling for differentiation purpose: the input voltage $V_{IN}$ of FIG. 1 is re-labeled to the first input voltage $V_{IN1}$; the first circuit node 101 of FIG. 1 is re-labeled to a summing node 601; the passive input network of impedance $Z_{IN}$ of FIG. 1 is re-labeled to a first passive input network of impedance $Z_{IN1}$; the input current $I_{IN}$ of FIG. 1 is re-labeled to a first input current $I_{IN1}$; the sum current $I_S$ of FIG. 1 is re-labeled to $I'_S$; the output voltage $V_{OUT}$ of FIG. 1 is re-labeled to $V'_{OUT}$; the digital signal D in FIG. 1 is re-labeled to D'; the adaptive current source 120 of FIG. 1 is re-labeled to 630; and the extension part 620 is labeled as a second passive input network of impedance $Z_{IN2}$. The extension part 620 (which in the particular exemplary embodiment 600 comprises a capacitor 621 and a resistor 622) couples the second input voltage $V_{IN2}$ to the summing node 601. The current flowing from the extension part 620 to the summing node 601 is labeled as the second input current $I_{IN2}$. Due to the re-labeling, equation (2) is rewritten as $$I_{IN1} \approx V_{IN1}/Z_{IN1} \quad (11)$$

Since the summing node 601 is a low-impedance node, as explained earlier, the second input current $I_{IN2}$ is approximately equal to the second input voltage $V_{IN2}$ divided by impedance $Z_{IN2}$, i.e.

$$I_{IN2} \approx V_{IN2}/Z_{IN2} \quad (12)$$

Those of ordinary skill in the art can readily recognize that, due to the extension part 620, the output $V'_{OUT}$ is:

$$V'_{OUT} \approx (V_{IN1} - V_{DN1}) \cdot G_1 + V_{IN2} \cdot G_2 \quad (13)$$

where $$G_1 = Z_L/Z_{IN1}. \quad (14)$$

and $$G_2 = Z_L/Z_{IN2}. \quad (15)$$

Here, $V_{DN1}$ is a first deterministic voltage noise within the first input voltage $V_{IN1}$. $V_{DN1}$ is cancelled because the adaptive current $I'_B$ is adjusted to offset a first deterministic current noise $I_{DN1}$ within the first input current $I_{IN1}$, where $$I_{DN1} \approx V_{DN1}/Z_{IN1}, \quad (16)$$

as explained earlier but now re-phrased based on the new labeling. Therefore, amplifier 600 fulfills functions of summing, amplification, and deterministic noise cancellation concurrently.

In an alternative embodiment, the second input voltage $V_{IN2}$ contains a second deterministic voltage $V_{DN2}$, resulting in a second deterministic current $I_{DN2}$ within the second input current $I_{IN2}$, where $$I_{DN2} \approx V_{DN2}/Z_{IN2} \quad (17)$$

The adaptive current source $I'_B$ is adjusted to offset a sum of the first deterministic current noise $I_{DN1}$ within the first input current $I_{IN1}$ and the second deterministic current noise $I_{DN2}$ within the second input current $I_{IN2}$, resulting in $$V'_{OUT} \approx (V_{IN1} - V_{DN1}) \cdot G_1 + (V_{IN2} - V_{DN2}) \cdot G_2 \quad (18)$$

In other words, amplifier 600 provides amplification to both the first input voltage $V_{IN1}$ and the second input voltage $V_{IN2}$ while also cancelling the first deterministic voltage noise $V_{DN1}$ in the first input voltage $V_{IN1}$ and the second deterministic voltage noise $V_{DN2}$ in the second input voltage $V_{IN2}$. This is workable as long as both the first deterministic voltage noise $V_{DN1}$ and the second deterministic voltage noise $V_{DN2}$ can be estimated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a passive input network of an input impedance configured to couple an input voltage to a first circuit node;
   an adaptive current source configured to output an adaptive bias current to the first circuit node;
   a cascode device controlled by a control voltage and configured to receive a sum current from the first circuit node and output an output current to a second circuit node; and
   a load network of a load impedance configured to provide termination to the second circuit node, wherein the adaptive bias current is dynamically adapted to track a deterministic noise component in the input voltage.

2. The circuit of claim 1, wherein the passive input network comprises a series connection of a resistor and a capacitor.

3. The circuit of claim 1, wherein the adaptive current source comprises a plurality of current sources configured to output a plurality of currents that can be conditionally passed to the first circuit node in accordance with a plurality of logical signals, respectively.

4. The circuit of claim 1 further comprises a gain boosting operational amplifier configured to receive a voltage at the first circuit node and output the control voltage.

5. The circuit of claim 1, wherein the deterministic noise is an echo.

6. The circuit of claim 1, wherein a gain factor is determined by a ratio between the load impedance and the input impedance.

7. The circuit of claim 1, wherein the load impedance is tunable.

8. A circuit comprising:
   a first passive input network of a first input impedance configured to couple a first input voltage to a first circuit node;
   a second passive input network of a second input impedance configured to couple a second input voltage to the first circuit node;
   an adaptive current source configured to output an adaptive bias current to the first circuit node;
   a cascode device controlled by a control voltage and configured to receive a sum current from the first circuit node and output an output current to a second circuit node; and
   a load network of a load impedance configured to provide termination to the second circuit node, wherein the adaptive bias current is dynamically adapted to track a deterministic noise component in one of the first input voltage and the second input voltage.

9. The circuit of claim 8, wherein both the first passive input network and the second passive input network comprise a series connection of a resistor and a capacitor.

10. The circuit of claim 8, wherein the adaptive current source comprises a plurality of current sources configured to output a plurality of currents that can be conditionally passed to the first circuit node in accordance with a plurality of logical signals, respectively.

11. The circuit of claim 8 further comprises a gain boosting operational amplifier configured to receive a voltage at the first circuit node and outputting the control voltage.

12. The circuit of claim 8, wherein a first gain factor is determined by a ratio between the load impedance and the first input impedance and a second gain factor is determined by a ratio between the load impedance and the second input impedance.

13. The circuit of claim 8, wherein the adaptive bias current is dynamically adapted to track a sum of a first deterministic noise component in the first input voltage and a second deterministic noise in the second input voltage.

14. A method comprising:
receiving an input voltage;
coupling the input voltage, using a passive input network, to a first circuit node;
providing an adaptive bias current to the first circuit node;
passing a sum current from the first circuit node to a second circuit node using a cascode device controlled by a control voltage;
terminating the second circuit node with a load network; and
adapting the adaptive bias current in accordance with a deterministic noise in the input voltage.

15. The method of claim 14 further comprising: dynamically adjusting the control voltage in accordance with a negative feedback from a voltage at the first circuit node.

16. The method of claim 15, wherein the negative feedback comprises using an operational amplifier receiving the voltage at the first circuit node and outputting the control voltage.

17. A method comprising:
receiving a first input voltage;
coupling the first input voltage, using a first passive input network, to a first circuit node;
receiving a second input voltage;
coupling the second input voltage, using a second passive input network, to the first circuit node;
providing an adaptive bias current to the first circuit node;
passing a sum current from the first circuit node to a second circuit node using a cascode device controlled by a control voltage;
terminating the second circuit node with a load network; and
adapting the adaptive bias current in accordance with a deterministic noise in one of the input first input voltage and the second input voltage.

18. The method of claim 17 further comprising: dynamically adjusting the control voltage in accordance with a negative feedback from a voltage at the first circuit node.

19. The method of claim 18, wherein the negative feedback comprises using an operational amplifier receiving the voltage at the first circuit node and outputting the control voltage.

20. The method of claim 17, wherein the load network comprises a tunable resistor.

* * * * *